United States Patent
Cheng et al.

(10) Patent No.: US 12,310,031 B2
(45) Date of Patent: May 20, 2025

(54) MULTI-LAYER OVONIC THRESHOLD SWITCH (OTS) FOR SWITCHING DEVICES AND MEMORY DEVICES USING THE SAME

(71) Applicant: MACRONIX INTERNATIONAL CO., LTD., Hsinchu (TW)

(72) Inventors: Huai-Yu Cheng, White Plains, NY (US); Alexander Grun, Mt. Kisco, NY (US)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 536 days.

(21) Appl. No.: 17/860,446

(22) Filed: Jul. 8, 2022

(65) Prior Publication Data

US 2024/0015987 A1 Jan. 11, 2024

(51) Int. Cl.
H10B 63/00 (2023.01)
H10N 70/00 (2023.01)

(52) U.S. Cl.
CPC ............ *H10B 63/24* (2023.02); *H10B 63/84* (2023.02); *H10N 70/021* (2023.02); *H10N 70/841* (2023.02)

(58) Field of Classification Search
None
See application file for complete search history.

(56) References Cited

U.S. PATENT DOCUMENTS

| | | |
|---|---|---|
| 3,271,591 A | 9/1966 | Ovshinsky |
| 3,343,034 A | 9/1967 | Ovshinsky |
| 3,530,441 A | 9/1970 | Ovshinsky |
| 3,571,669 A | 3/1971 | Fleming |
| 3,571,670 A | 3/1971 | Ovshinsky |
| 3,571,671 A | 3/1971 | Ovshinsky |
| 3,571,672 A | 3/1971 | Ovshinsky |
| 3,588,638 A | 6/1971 | Fleming et al. |
| 3,611,063 A | 10/1971 | Neale |
| 3,619,732 A | 11/1971 | Neale |
| 3,656,032 A | 4/1972 | Henisch |

(Continued)

FOREIGN PATENT DOCUMENTS

| | | |
|---|---|---|
| CN | 1568494 A | 1/2005 |
| CN | 102453823 A | 5/2012 |

(Continued)

OTHER PUBLICATIONS

Chen, et al., "Endurance Improvement of Ge2Sb2Te5-Based Phase Change Memory," IEEE Int'l Memory Workshop, 2009, May 10-14, 2009, 2 pages. cited by applicant.

(Continued)

*Primary Examiner* — Scott B Geyer
(74) *Attorney, Agent, or Firm* — Andrew L. Dunlap; Haynes Beffel & Wolfeld LLP

(57) ABSTRACT

A switching device is provided. The device includes a first electrode, a second electrode and a multi-layer ovonic threshold switch (OTS) between the first and second electrodes, the multi-layer OTS including a first layer and a second layer. The first layer and the second layer are different compositions, and the second layer includes germanium Ge and nitrogen N. The switching device can be thermally stable to temperatures over 600° C. Further, the switching device can be used in three-dimensional (3D) cross-point memory.

20 Claims, 8 Drawing Sheets

(56) References Cited

U.S. PATENT DOCUMENTS

| | | |
|---|---|---|
| 3,846,767 A | 11/1974 | Cohen |
| 3,875,566 A | 4/1975 | Helbers |
| 3,886,577 A | 5/1975 | Buckley |
| 3,961,314 A | 6/1976 | Klose et al. |
| 3,980,505 A | 9/1976 | Buckley |
| 5,159,661 A | 10/1992 | Ovshinsky et al. |
| 5,177,567 A | 1/1993 | Klersy et al. |
| 5,687,112 A | 11/1997 | Ovshinsky |
| 6,579,760 B1 | 6/2003 | Lung |
| 6,800,504 B2 | 10/2004 | Li et al. |
| 6,967,344 B2 | 11/2005 | Ovshinsky et al. |
| 6,995,390 B2 | 2/2006 | Tsukui |
| 7,348,205 B2 | 3/2008 | Campbell et al. |
| 7,483,293 B2 | 1/2009 | Pinnow et al. |
| 7,501,648 B2 | 3/2009 | Chen et al. |
| 7,688,619 B2 | 3/2010 | Lung et al. |
| 7,893,419 B2 | 2/2011 | Hudgens et al. |
| 7,902,538 B2 | 3/2011 | Lung |
| 7,903,457 B2 | 3/2011 | Lung |
| 7,929,340 B2 | 4/2011 | Lung et al. |
| 8,138,028 B2 | 3/2012 | Lung et al. |
| 8,148,707 B2 | 4/2012 | Ovshinsky |
| 8,178,387 B2 | 5/2012 | Cheng et al. |
| 8,259,485 B2 | 9/2012 | Yang et al. |
| 8,315,088 B2 | 11/2012 | Lung |
| 8,324,605 B2 | 12/2012 | Lung et al. |
| 8,330,137 B2 | 12/2012 | Schrott et al. |
| 8,344,348 B2 | 1/2013 | Wicker |
| 8,363,463 B2 | 1/2013 | Shih et al. |
| 8,374,019 B2 | 2/2013 | Wu et al. |
| 8,395,927 B2 | 3/2013 | Kreupl et al. |
| 8,410,468 B2 | 4/2013 | Zheng |
| 8,426,242 B2 | 4/2013 | Cheng et al. |
| 8,467,236 B2 | 6/2013 | Campbell |
| 8,634,235 B2 | 1/2014 | Lung et al. |
| 8,646,666 B2 | 2/2014 | May |
| 8,772,747 B2 | 7/2014 | Cheng et al. |
| 8,916,414 B2 | 12/2014 | Cheng et al. |
| 8,932,901 B2 | 1/2015 | Cheng |
| 8,946,666 B2 | 2/2015 | Cheng et al. |
| 9,177,640 B2 | 11/2015 | Shintani et al. |
| 9,190,609 B2 | 11/2015 | Zheng |
| 9,214,229 B2 | 12/2015 | Cheng et al. |
| 9,336,879 B2 | 5/2016 | Lung et al. |
| 9,337,421 B2 | 5/2016 | Chin et al. |
| 9,659,998 B1 | 5/2017 | Lung |
| 9,917,252 B2 | 3/2018 | Cheng et al. |
| 10,050,196 B1 | 8/2018 | Cheng et al. |
| 10,128,312 B2 | 11/2018 | Wu et al. |
| 10,157,671 B1 | 12/2018 | Lung et al. |
| 10,224,371 B2 | 3/2019 | Wu et al. |
| 10,256,406 B2 | 4/2019 | Collins et al. |
| 10,374,009 B1 | 8/2019 | Cheng et al. |
| 10,541,271 B2 | 1/2020 | Cheng et al. |
| 10,593,875 B2 | 3/2020 | Lai et al. |
| 10,978,511 B1 | 4/2021 | Cheng et al. |
| 11,158,787 B2 | 10/2021 | Cheng et al. |
| 11,380,840 B2 | 7/2022 | Manfrini |
| 2005/0018098 A1 | 1/2005 | Sugihara et al. |
| 2007/0171705 A1 | 7/2007 | Parkinson |
| 2008/0142777 A1 | 6/2008 | Park et al. |
| 2008/0253166 A1 | 10/2008 | Raberg et al. |
| 2008/0272807 A1 | 11/2008 | Lowrey |
| 2009/0014705 A1 | 1/2009 | Hsu et al. |
| 2009/0194759 A1 | 8/2009 | Chin et al. |
| 2009/0230375 A1 | 9/2009 | Liang et al. |
| 2010/0051895 A1 | 3/2010 | Hampton |
| 2010/0054029 A1 | 3/2010 | Happ et al. |
| 2010/0328996 A1 | 12/2010 | Shih et al. |
| 2011/0049456 A1 | 3/2011 | Lung et al. |
| 2011/0084240 A1 | 4/2011 | Schell et al. |
| 2011/0095257 A1 | 4/2011 | Xu et al. |
| 2011/0097825 A1 | 4/2011 | Cheng et al. |
| 2011/0180775 A1 | 7/2011 | Lin et al. |
| 2011/0207284 A1 | 8/2011 | Tominaga et al. |
| 2011/0317480 A1 | 12/2011 | Lung et al. |
| 2012/0025164 A1 | 2/2012 | Deweerd |
| 2012/0062267 A1 | 3/2012 | Saito |
| 2012/0181499 A1 | 7/2012 | Chuang et al. |
| 2012/0193595 A1 | 8/2012 | Cheng et al. |
| 2012/0326111 A1 | 12/2012 | Cheng et al. |
| 2013/0043375 A1 | 2/2013 | Baleine et al. |
| 2013/0105759 A1 | 5/2013 | Cheng |
| 2013/0234093 A1 | 9/2013 | Cheng et al. |
| 2013/0270505 A1 | 10/2013 | Dahmani |
| 2013/0277638 A1 | 10/2013 | Moradpour et al. |
| 2014/0101371 A1 | 4/2014 | Nguyen et al. |
| 2014/0241031 A1* | 8/2014 | Bandyopadhyay .. H10N 70/063 365/96 |
| 2014/0264240 A1 | 9/2014 | Cheng et al. |
| 2014/0376307 A1 | 12/2014 | Shintani |
| 2014/0376309 A1 | 12/2014 | Cheng et al. |
| 2015/0048291 A1 | 2/2015 | Cheng et al. |
| 2015/0236259 A1* | 8/2015 | Ramaswamy ......... H10B 63/20 257/4 |
| 2015/0262671 A1* | 9/2015 | Sugimae ............ H10N 70/8416 710/316 |
| 2016/0276022 A1 | 9/2016 | Redaelli |
| 2016/0336378 A1 | 11/2016 | Ohba et al. |
| 2016/0372188 A1 | 12/2016 | Lung et al. |
| 2016/0372661 A1 | 12/2016 | Cheng et al. |
| 2017/0076797 A1 | 3/2017 | Lung et al. |
| 2017/0244026 A1 | 8/2017 | Wu et al. |
| 2017/0250222 A1 | 8/2017 | Wu et al. |
| 2017/0263863 A1 | 9/2017 | Lung et al. |
| 2017/0271581 A1 | 9/2017 | Seong et al. |
| 2017/0316822 A1* | 11/2017 | Sei ..................... G11C 11/1659 |
| 2018/0012938 A1 | 1/2018 | Lung et al. |
| 2018/0019391 A1 | 1/2018 | Ohba et al. |
| 2018/0040669 A1 | 2/2018 | Wu |
| 2018/0051370 A1 | 2/2018 | Pinter |
| 2018/0277601 A1 | 9/2018 | Ahn et al. |
| 2019/0043924 A1 | 2/2019 | Conti et al. |
| 2019/0081103 A1 | 3/2019 | Fantini et al. |
| 2019/0115393 A1 | 4/2019 | Cheng et al. |
| 2019/0148456 A1 | 5/2019 | Wu et al. |
| 2019/0252609 A1 | 8/2019 | Sei et al. |
| 2019/0334083 A1* | 10/2019 | Wu ..................... H10N 70/826 |
| 2019/0355790 A1 | 11/2019 | Lung et al. |
| 2019/0355903 A1 | 11/2019 | Lung et al. |
| 2019/0386213 A1 | 12/2019 | Lai et al. |
| 2019/0393268 A1 | 12/2019 | Lai et al. |
| 2020/0052036 A1 | 2/2020 | Ikarashi et al. |
| 2020/0119259 A1 | 4/2020 | Ahn et al. |
| 2020/0227475 A1 | 7/2020 | Park et al. |
| 2020/0295083 A1 | 9/2020 | Cheng et al. |
| 2020/0295086 A1* | 9/2020 | Iwasaki ................ H10N 70/20 |
| 2021/0111224 A1 | 4/2021 | Cheng et al. |
| 2021/0143216 A1 | 5/2021 | Lai et al. |
| 2021/0184112 A1 | 6/2021 | Cheng et al. |
| 2021/0210554 A1 | 7/2021 | Cheng et al. |
| 2021/0249600 A1 | 8/2021 | Chien et al. |
| 2021/0280781 A1 | 9/2021 | Kim et al. |

FOREIGN PATENT DOCUMENTS

| | | | |
|---|---|---|---|
| CN | 107210302 A | 9/2017 | |
| CN | 107689419 A | 2/2018 | |
| CN | 110571235 A | 12/2019 | |
| CN | 110931635 A | 3/2020 | |
| JP | 2021190574 A * | 12/2021 | ......... H01L 27/2463 |
| TW | 201633507 A | 9/2016 | |
| TW | 201700407 A | 1/2017 | |
| TW | 201733177 A | 9/2017 | |
| TW | 201801300 A | 1/2018 | |
| TW | 201907543 A | 2/2019 | |
| TW | 202006931 A | 2/2020 | |
| TW | 202036850 A | 10/2020 | |

(56) References Cited

FOREIGN PATENT DOCUMENTS

| TW | I729155 B | 6/2021 |
| TW | I764622 B | 5/2022 |

OTHER PUBLICATIONS

Cheng et al., "A thermally robust phase change memory by engineering the Ge/N concentration in (Ge, N)xSbyTe z phase change material" 2012 Int'l IEEE IEDM, Dec. 10-13, 2012, 4 pages.

Cheng et al., "An ultra high endurance and thermally stable selector based on TeAsGeSiSe chalcogenides compatible with BEOL IC Integration for cross-point PCM," IEEE IEDM Dec. 2-6, 2017, 4 pages.

Cheng et al., "Si Incorporation into AsSeGe Chalcogenides for High Thermal Stability, High Endurance and Extremely Low Vth Drift 3D Stackable Cross-Point Memory," IEEE Symp. on VLSI Tech., Jun. 16-19, 2020, 2 pages.

Cheng et al., "The Crystallization Behavior of Ga—Sb Materials as a Function of Composition for Phase Change Random Access Memory," Phase Change and Ovonics Symposium, Sep. 2011, 7 pages.

Cheng et al., "Ultra-High Endurance and Low IOFF Selector based on AsSeGe Chalcogenides for Wide Memory Window 3D Stackable Crosspoint Memory," IEEE IEDM Dec. 1-5, 2018, 4 pages.

Cheng et al., Ga46Sb54 Material for Fast Switching and Pb-Free Soldering Reflow Process Complying Phase-Change Memory, Ecs J. Solid State Sci. Technol. 2014 vol. 3, issue 7, Jun. 2014, p. 263-p. 267.

Cheng, et al., "A high performance phase change memory with fast switching speed and high temperature retention by engineering the GexSbyTez phase change material," 2011 IEEE Int'l IEDM, Dec. 5-7, 2011, 4 pages.

Cheng, H.Y., et al., "Atomic-level engineering of phase change material for novel fast-switching and high-endurance PCM for storage class memory application," IEEE Int'l Electron Devices Meeting (IEDM), Dec. 9-11, 2013, pp. 30.6.1,30.6.4. cited byapplicant.

Ciocchini, N., et al. "Unified reliability modeling of Ge-rich phase change memory for embedded applications" IEEE Int'l Electron Devices Meeting (IEDM), Dec. 9-11, 2013, pp. 22.1.1,22.1.4.

Guo et al., "A Review of Germanium-Antimony-Telluride Phase Change Materials for Non-Volatile Memories and Optical Modulators," Appl. Sci. Feb. 4, 2019, 26 pages; www.mdpi.com/journal/applsci.

Kao et al., "Antimony alloys for phase-change memory with high thermal stability," Scripta Materialia vol. 63, issue 8, Oct. 2010, 855-858.

Kim, I.S., et al., "High performance PRAM cell scalable to sub-20nm technology with below 4F2 cell size, extendable to DRAM applications," 2010 Symp. on VLSI Technology, Jun. 15-17, 2010, 2 pages.

Le Gallo et al., "An overview of phase-change memory device physics," J. Phys. D Appl. Phys., vol. 53, No. 21, Mar. 26, 2020, 28 pages.

Lu et al., Ga14Sb86 film for ultralong data retention phase-change memory, J. Appl. Phys. 109, 064503, Jun. 2011, 4 pages.

Mark-Lapedus, "Embedded Phase-Change Memory Emerges," https://semiengineering.com/author/mark-lapedus, Jan. 24, 2019, 13 pages.

Morales-Sanchez et al., "Structural, electric and kinetic parameters of ternary alloys of GeSbTe," Thin Solid Films, vol. 471, Issues 1-2, Jan. 3, 2005, pp. 243-247.

Navarro, G., et al., "Trade-off between SET and data retention performance thanks to innovative materials for phase-change memory," IEEE Int'l Electron Devices Meeting (IEDM), Dec. 9-11, 2013, pp. 21.5.1,21.5.4.

NIST Special Publication 800-38D, Dworkin, "Recommendation for Block Cipher Modes of Operation: Galois/Counter Mode (GCM) and GMAC," Nov. 2007, 39 pages.

Ohyanagi et al., "Special Electrical Characteristics of Superlattice Phase Change Memory," ECS Trans., vol. 58, Issue 5, Oct. 31, 2013, pp. 135-158.

Ovshinsky, "New Transformative Possibilities for Ovonic Devices," E*PCOS2010, European Symposium on Phase Change and Ovonic Science, Milan, Italy Sep. 6-7, 2010, 9 pages.

Putero et al., Unusual crystallization behavior in Ga—Sb phase change alloys, APL Mat. 1, Jun. 21, 2001, Dec. 2013, 7 pages.

Raoux, et al. "Phase change materials and phase change memory," MRS Bulletin, 39(8), 703-710.

Schuller, Ivan K., Stevens, Rick, Pino, Robinson, and Pechan, Michael. Neuromorphic Computing—From Materials Research to Systems Architecture Roundtable. "Report of a Roundtable Convened to Consider Neuromorphic Computing Basic Research Needs,"Oct. 29-30, 2015, 40 pages.

Shah et al., "GaSb-Ge pseudobinary phase diagram," Journal of Electronic Materials, vol. 11, Issue 1, Jan. 1982, 53-58.

Shanks, "Ovonic threshold switching characteristics," Journal of Non-Crystalline Solids, vol. 2, Jan. 1970, pp. 504-514.

Shin et al., "The effect of doping Sb on the electronic structure and the device characteristics of Ovonic Threshold Switches based on Ge—Se," Scientific Reports, Nov. 18, 2014, 5 pages.

Simpson et al., "Interfacial phase-change memory," Nature Nanotechnology, vol. 6, Jul. 3, 2011, 502-505.

Velea et al., "Te-based chalcogenide materials for selector applications," Scientific Reports, 7:8103, Aug. 14, 2019, 12 pages.

Wikipedia, "Rutherford backscattering spectrometry," downloaded Aug. 4, 2020, available at https://en.wikipedia.org/wiki/Rutherford_backscattering_spectrometry, 8 pages.

Wimmer, et al., Role of activation energy in resistance drift of amorphous phase change materials, Frontiers in Physics, Dec. 2014, vol. 2, Article 75, pp. 1-12.

Wu et al., "A 40nm Low-Power Logic Compatible Phase Change Memory Technology," IEEE IEDM 2018, Dec. 1-5, 2018, 4 pages.

Zuliani, P., et al., "Overcoming Temperature Limitations in Phase Change Memories With Optimized GexSbyTez," IEEE Trans. on Electron Devices, 60(12), Dec. 2013, pp. 4020,4026.

Guo et al., "SiC-Doped Ge2Sb2Te5 Phase Change Material: A Candidate for High DensityEmbedded Memory Application," Advanced Electronic Materials, vol. 4, Issue 8, Jun. 13, 2018, english abstract only, 7 pages.

* cited by examiner

| | $T_x$ | $V_t$ | $I_{off}$ nA @ 2V | Endurance (cell failures for 66 cells at 1E9 test cycles) |
|---|---|---|---|---|
| 30 nm thick OTS Single layer (8 at%In-AsSeGe) | 440 °C | 3.8 | 0.3 | 5 |
| Multi-layer (7 nm 8 at%In-AsSeGe / 3 nm GeN) (6 layers total) | <600 °C | 3.25 | 100 | 9 |
| Multi-layer (4 nm 8 at%In-AsSeGeIn / 1 nm Ge3N4) (12 layers total) | >600 °C | 4.75 | 0.97 | 1 |

| N2 Flow (sccm) | Ge at% | N at% |
|---|---|---|
| 2sccmN2 | 92.4 | 7.6 |
| 3sccmN2 | 83.8 | 16.2 |
| 4sccmN2 | 79.9 | 20.1 |
| 5sccmN2 | 77.5 | 22.5 |
| 9sccmN2 | 63.2 | 36.8 |
| 18sccmN2 | 52.5 | 47.5 |
| 28sccmN2 | 48.1 | 51.9 |
| 30sccmN2 | 44.7 | 55.3 |

MULTI-LAYER OVONIC THRESHOLD SWITCH (OTS) FOR SWITCHING DEVICES AND MEMORY DEVICES USING THE SAME

International Business Machines Corporation, a New York corporation, and Macronix International Corporation, Ltd., a Taiwan corporation, are parties to a Joint Research Agreement.

BACKGROUND

Field

The present invention relates to switching devices utilized in integrated circuits, including integrated circuit memory devices.

Description of Related Art

There are many applications for switching devices, such as transistors and diodes, in integrated circuits. The emergence of new nonvolatile memory (NVM) technologies, such as phase change memory, resistive memory, etc., has been motivated by exciting applications such as storage class memory, solid-state disks, embedded nonvolatile memory and neuromorphic computing. Many of these applications are packed densely in "cross-point" arrays (e.g., three dimensional (3D) cross-point memory) which can offer many gigabytes of storage.

In such arrays, access to any small subset of the array for accurate reading or low-power writing requires a strong nonlinearity in the current and voltage (i.e., IV) characteristics, such that the currents passing through the selected devices greatly exceed the residual leakage through non-selected devices. This nonlinearity can either be included explicitly, by adding a discrete access device at each cross-point, or implicitly with an NVM device which also exhibits highly nonlinear IV characteristics.

One type of switching device is known as the ovonic threshold switch (OTS), based on ovonic materials (e.g., chalcogenides). An OTS switch is characterized by a large drop in resistance at a switching threshold voltage and recovery of a high resistance, blocking state when the voltage falls below a holding threshold.

For example, switching devices including an OTS have been used in various programmable resistance memory devices comprising high density arrays of cells organized in a cross-point architecture. Some cross-point architectures utilize memory cells that include a phase change memory element or other resistive memory element in series with the OTS, for example. Other architectures are utilized, including a variety of 2-dimensional and 3-dimensional array structures, which can also utilize switching devices to select memory elements in the array. OTSs have also been proposed for a variety of other uses, including so-called neuromorphic computing.

Thermal stability of materials used in integrated circuits can be an important characteristic. For example, in back end of line (BEOL) processing of integrated circuits, temperatures around 400-450° C. or more can be generated, which can exceed crystallization transition temperatures or can degrade stability of various components, such as OTSs. In addition, in assembly of equipment, integrated circuits can be exposed to high temperatures during solder bonding or other high temperature assembly processes. Integrated circuits can also be exposed to high temperature during operation in the field. With these high temperatures in mind, the thermal stability of a OTS comprised of arsenic As, Selenium Se, Germanium Ge and Indium In can experience crystallization at 440° C., which can cause failure if the BEOL temperature, the soldering or bonding temperature or the operational temperature reaches or exceeds 440° C.

Therefore, it is desirable to provide an OTS for a switching device with improved thermal stability above 440° C. and improve endurance, along with relatively high threshold voltages, low leakage current, and fast switching speeds.

SUMMARY

A switching device is described comprising a first electrode, a second electrode, and a multi-layer ovonic threshold switch (OTS) between the first and second electrodes, the multi-layer OTS including a first layer and a second layer, wherein the first layer and the second layer can be of different compositions, and wherein the second layer can include germanium Ge and nitrogen N.

In a further embodiment, the Ge in the second layer can be in a range of 40 at % to 95 at % of the composition of the second layer and the N in the second layer can be in a range of 5 at % to 60 at % of the composition of the second layer.

In another embodiment, the Ge in the second layer can be in a range of 40 at % to 80 at % of the composition of the second layer and the N in the second layer can be in a range of 60 at % to 20 at % of the composition of the second layer.

In an embodiment, the Ge and N composition of the second layer can be Ge3N4.

In a further embodiment, the Ge and N composition of the second layer can be effective to have a crystallization transition temperature greater than 550° C.

In another embodiment the Ge and N composition of the second layer can be effective to have a crystallization transition temperature greater than 600° C.

In an embodiment, the first layer can include arsenic As, selenium Se and germanium Ge.

In another embodiment, the multi-layer OTS can include a plurality of the first layers and a plurality of the second layers, wherein the first layers and the second layers can be stacked in an alternating manner.

In a further embodiment, a thickness of each first layer of the plurality of the first layers can range from 2 nanometers to 15 nanometers, inclusive and a thickness of each second layer of the plurality of the second layers can range from 0.5 nanometers to 5 nanometers, inclusive In an embodiment, the first layer can further include indium In, wherein the As in the first layer can be in a range of 25 at % to 38 at %, the Se in the first layer can be in a range of 30 at % to 60 at %, the Ge in the first layer can be in a range of 8 at % to 20 at % and the In in the first layer can be in a range of 2 at % to 10 at %.

In another embodiment, the first layer can further include silicon Si.

In a further embodiment, the first layer can further include indium In.

In another embodiment, the multi-layer OTS can have a thickness in a range of 15 nanometers to 50 nanometers, inclusive.

In an embodiment, the multi-layer OTS includes six layers, including the first and second layers, wherein the third and fifth layers can have the same composition of the first layer, wherein the fourth and sixth layers can have the same composition of the second layer, and wherein the six layers can be disposed in the multi-layer OTS in numerical order, such that at least two even numbered layers are located between different pairs of odd numbered layers.

In a further embodiment, each odd numbered layer of the odd numbered layers can have a thickness of approximately 7 nanometers, and wherein each even numbered layer of the even numbered layers can have a thickness of approximately 3 nanometers, such that a thickness of the multi-layer OTS is approximately 30 nanometers.

In an embodiment, the multi-layer OTS can include twelve layers, including the first and second layers, wherein the third, fifth, seventh, ninth and eleventh layers can have the same composition of the first layer, wherein the fourth, sixth, eight, tenth and twelfth layers can have the same composition of the second layer, and wherein the twelve layers can be disposed in the multi-layer OTS in numerical order, such that at least five even numbered layers are located between different pairs of odd numbered layers.

In a further embodiment, wherein each odd numbered layer of the odd numbered layers can have a thickness of approximately 4 nanometers, and wherein each even numbered layer of the even numbered layers can have a thickness of approximately 1 nanometer, such that a thickness of the multi-layer OTS is approximately 30 nanometers.

In another embodiment a method of forming a memory device is provided. The method can include providing a first electrode, providing a second electrode, and providing a memory element in contact with the first electrode, and providing a multi-layer ovonic threshold switch (OTS) in series with the memory element and between the first and second electrodes, the multi-layer OTS including a first layer and a second layer, the first layer and the second layer having different compositions, and the second layer including germanium Ge and nitrogen N.

Other aspects and advantages of the present invention can be seen on review of the drawing alongside the detailed description and the claims which follow.

BRIEF DESCRIPTION OF THE DRAWINGS

FIG. 5 is a table illustrating the result of testing a single-layer OTS and two different types of multi-layer OTSs.

DETAILED DESCRIPTION

A detailed description of embodiments of the present invention is provided with reference to the FIGS. 1-9.

Figure 1:
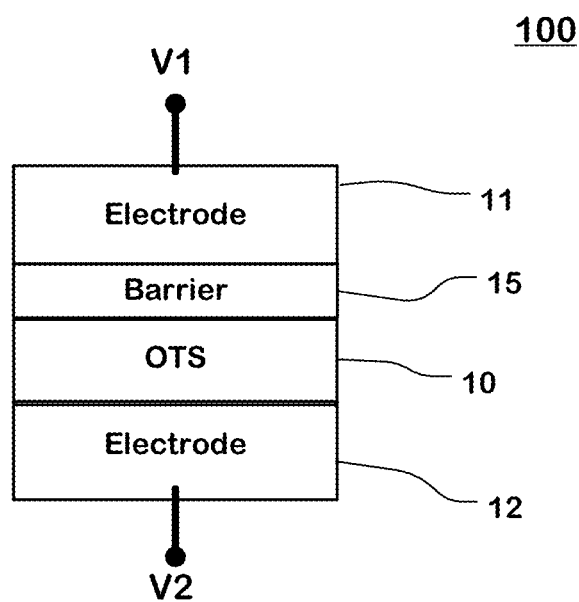
FIG. 1 is a simplified diagram of a cross-section of a switching device which includes a single-layer ovonic threshold switch (OTS).

FIG. 1 is a simplified diagram of a cross-section of a switching device including a single-layer ovonic threshold switch (OTS). Specifically, FIG. 1 illustrates that a switching device 100 includes a first electrode 11, a second electrode 12, a single-layer OTS 10 and a barrier layer 15. The single-layer OTS 10 and the barrier layer 15 are in series between the first electrode 11 and the second electrode 12. The switching device 100 can be implemented without the barrier layer 15. A voltage V1 can be applied to the first electrode 11, and a voltage V2 can be applied to the second electrode 12. The single-layer OTS 10 turns on and off depending on voltages applied thereto, allowing current to pass through when turned on. For example, when the voltage (V1-V2) across the single-layer OTS 10 between the first electrode 11 and the second electrode 12 exceeds a threshold voltage ($V_t$) of the single-layer OTS 10, then the single-layer OTS 10 is turned on and switched from a high-impedance off state to a low-impedance state. When the voltage across the first electrode 11 and the second electrode 12 is below a holding threshold voltage ($V_h$) of the single-layer OTS 10, the single-layer OTS 10 returns to the high-impedance off state, such that little to no current passes through the single-layer OTS 10. The switching device 100 shown in FIG. 1 can have a highly nonlinear current versus voltage characteristic, making it suitable for use as a switching component in a high density memory device, and in other settings.

The barrier layer 15 can provide one or more of resistance, adhesion and diffusion barrier functions. The barrier layer 15 may have a layer of conductive material with a thickness of about 5 to about 50 nm, preferably about 20 nm. The barrier layer 15 can be a composition including carbon (including essentially pure carbon), or of silicon and carbon on a top surface of a material of the single-layer OTS 10, or other materials. Other example materials for the barrier layer 15 can be a metal nitride, such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), or tantalum aluminum nitride (TaAlN). In addition to metal nitrides, the barrier layer 15 can comprise materials such as carbon, doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), or tantalum oxynitride (TaON).

A second barrier layer can be disposed on a second surface (e.g., bottom surface) opposite said first mentioned surface, of the single-layer OTS 10, in some embodiments.

The single-layer OTS 10 can have a composition of chalcogenide materials, such as, for example, (i) Arsenic As, selenium Se and germanium Ge (i.e., AsSeGe), (ii) AsSeGe and Silicon Si (i.e., AsSeGeSi), (iii) AsSeGeSi and indium In (i.e., AsSeGeSiIn) and (iv) AsSeGeIn. Other compositions of materials that would be apparent to a person of ordinary skill in the art can be used to form the single-layer OTS 10.

These above-described compositions can be thermally stable to temperatures around of 400° C. and can have a crystallization transition temperature of around 440° C. For example, AsSeGeIn can have relatively poor thermal stability at around 440° C., at which crystallization occurs. As discussed above, it is not uncommon for temperatures above 440° C. to be reached during (BEOL) processing, soldering, other various states of assembly and during operation in the field. Accordingly, a multi-layer OTS is described in this document that provides thermal stability at much higher temperatures.

Figure 2:
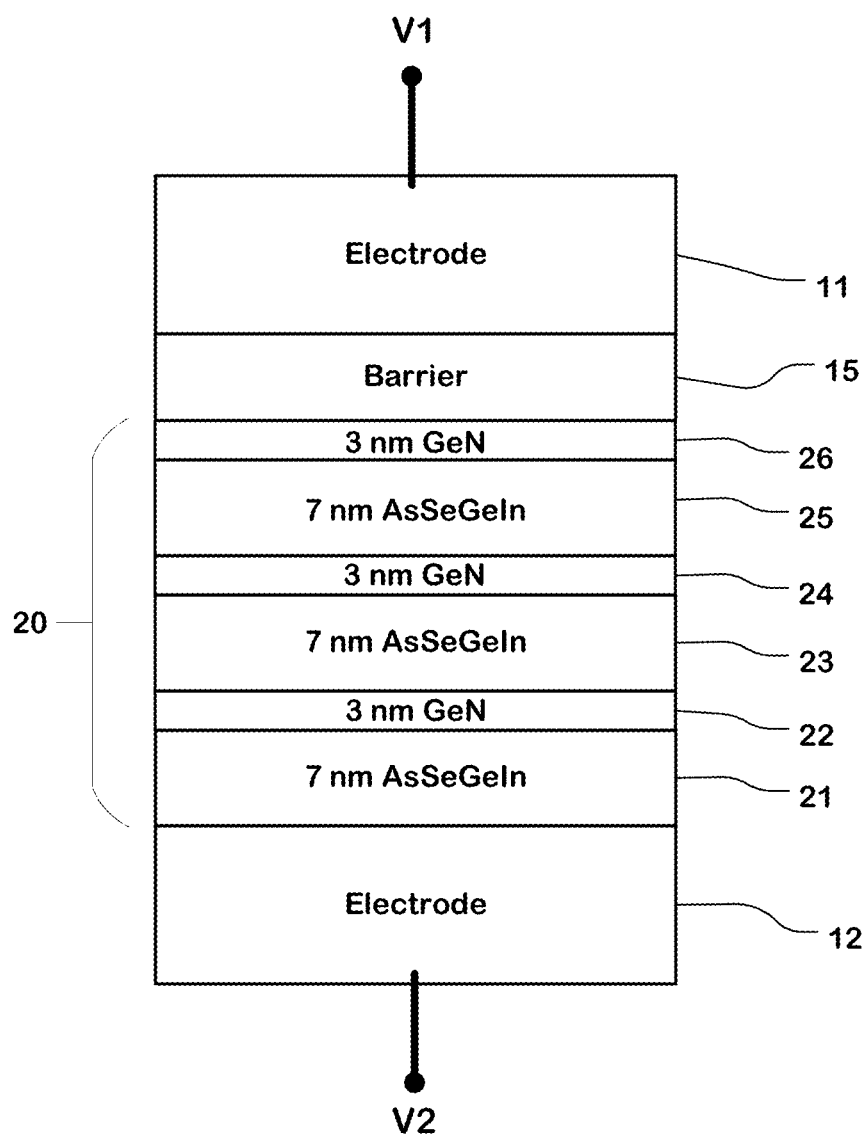
FIG. 2 is a simplified diagram of a cross-section of a switching device including a multi-layer ovonic threshold switch (OTS).

FIG. 2 is a simplified diagram of a cross-section of a switching device including a multi-layer ovonic threshold switch (OTS). Similar to the switching device 100 of FIG. 1 including the single-layer OTS 10, FIG. 2 illustrates that a switching device 200 includes a first electrode 11, a second electrode 12 and a barrier layer 15. Redundant descriptions of the first electrode 11, the second electrode 12 and the barrier layer 15 are omitted. Further, the switching device 200 includes a multi-layer OTS 20. The number of layers in the multi-layer OTS 20 can vary. In the embodiment illustrated in FIG. 2, the multi-layer OTS 20 includes 6 layers. In other embodiments, the multi-layer OTS 20 can include fewer than 6 layers and can include more than 6 layers.

Specifically, the multi-layer OTS 20, starting from the bottom, includes a bottom 7 nanometer (nm) layer of AsSeGeIn 21 (e.g., a first layer), a 3 nm layer of GeN 22 (e.g., a second layer), another 7 nm layer of AsSeGeIn 23 (e.g. a third layer), another 3 nm layer of GeN 24 (e.g., a fourth layer), another 7 nm layer of AsSeGeIn 25 (e.g., a fifth layer) and a top 3 nm layer of GeN 26 (e.g., a sixth layer). Placing the GeN layers between the AsSeGeIn layers results in the multi-layer OTS 20 having a higher crystallization temperature and increased durability, as compared to the single-layer OTS 10 of FIG. 1. The thicknesses of layers 21, 22, 23, 24, 25 and 26 and the composition of layers 21, 22, 23, 24, 25 and 26 can be varied, as discussed below.

For example, the atomic percentages (at %) of the materials in layers 21, 23 and 25 can be as follows: (i) As provided at 25 at % to 38 at %, (ii) Se provided at 30 at % to 60 at %, (iii) Ge provided at 8 at % to 20 at %, and (iv) In provided at 2 at % to 10 at %. Additionally, the thicknesses of the layers 21, 22, 23, 24, 25 and 26 can vary, such that the total thickness of the multi-layer OTS 20 can range from 15 nm to 50 nm. More specifically, the thicknesses of layers 21, 23 and 25 can range from 2 nm to 15 nm and the thicknesses of layers 22, 24 and 26 can range from 0.5 nm to 5 nm. The ratio of Ge to N in layers 22, 24 and 26 can vary.

Additionally, the thicker layers (e.g., the 7 nm layers) can be comprised of AsSeGe, AsSeGeSi, AsSeGeInSi, etc. The composition of the thicker layers (e.g., 7 nm layers) and the thinner layers (e.g., the 3 nm layers) can be provided in amounts effective to (i) switch using an applied voltage pulse less than 5 nanoseconds in duration at a threshold voltage $V_t$<4V and (ii) have a crystallization transition temperature greater than 550° C. Furthermore, the composition of the thicker layers (e.g., 7 nm layers) and the thinner layers (e.g., the 3 nm layers) can be provided in amounts effective to (i) switch using an applied voltage pulse less than 5 nanoseconds in duration at a threshold voltage $V_t$<5V and (ii) have a crystallization transition temperature greater than 600° C. Specific compositions and test results are discussed in more detail below.

Figure 3:
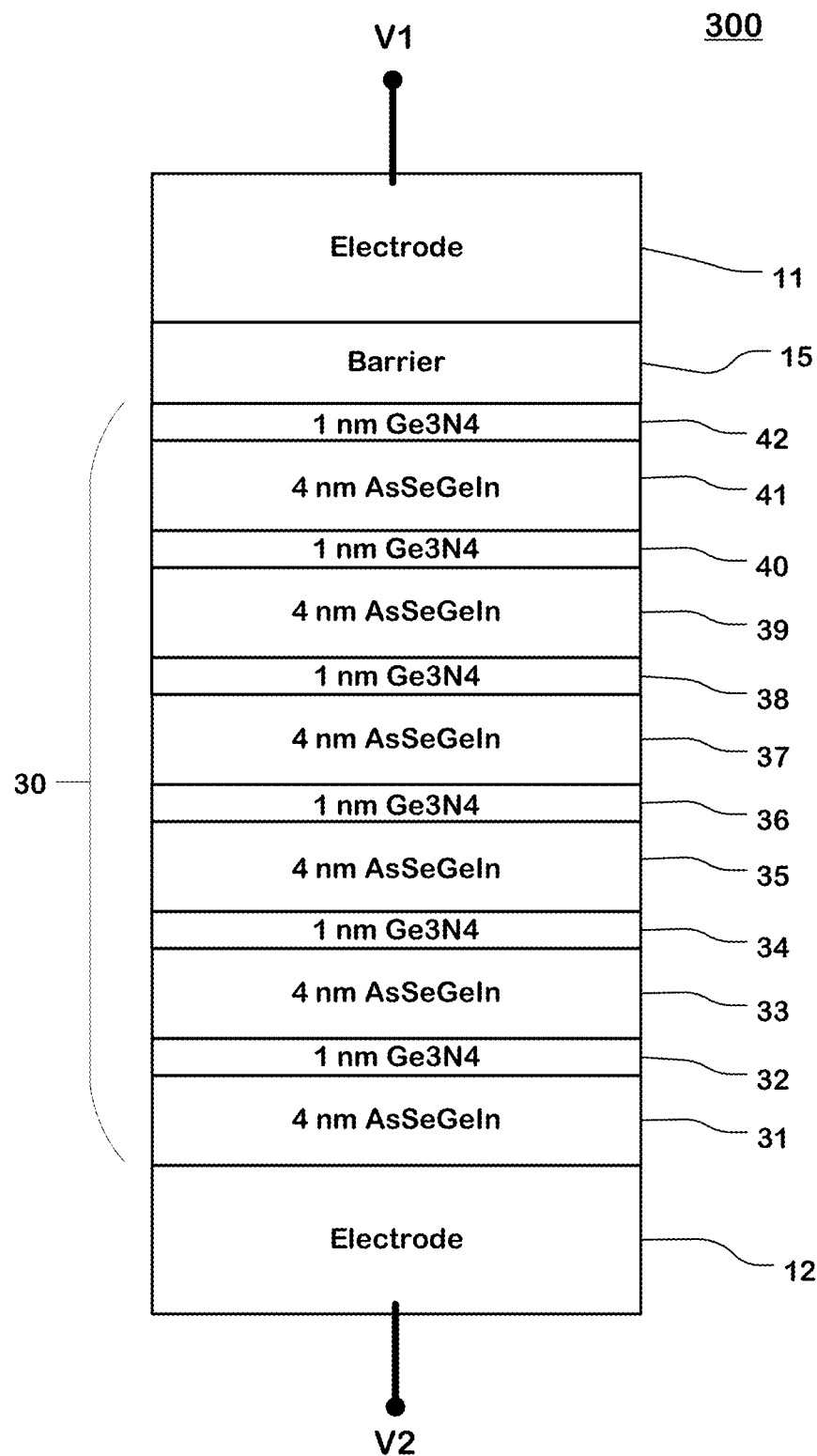
FIG. 3 is a simplified diagram of a cross-section of a switching device including a multi-layer ovonic threshold switch (OTS).

FIG. 3 is a simplified diagram of a cross-section of a switching device including a multi-layer ovonic threshold switch (OTS). Similar to the switching device 100 of FIG. 1 including the single-layer OTS 10, FIG. 3 illustrates that a switching device 300 includes a first electrode 11, a second electrode 12 and a barrier layer 15. Redundant descriptions of the first electrode 11, the second electrode 12 and the barrier layer 15 are omitted. Further, the switching device 300 includes a multi-layer OTS 30. The number of layers in the multi-layer OTS 30 can vary. In the embodiment illustrated in FIG. 3, the multi-layer OTS 30 includes 12 layers (e.g., 12 stacked and alternative layers). In other embodiments, the multi-layer OTS 30 can include fewer than 12 (stacked and alternating) layers and can include more than 12 (stacked and alternating) layers.

Specifically, the multi-layer OTS 30, starting from the bottom, includes a bottom 4 nm layer of AsSeGeIn 31 (e.g., a first layer), a 1 nm layer of Ge3N4 32 (e.g., a second layer), another 4 nm layer of AsSeGeIn 33 (e.g., a third layer), another 1 nm layer of Ge3N4 34 (e.g., a fourth layer), another 4 nm layer of AsSeGeIn 35 (e.g., a fifth layer), another 1 nm layer of Ge3N4 36 (e.g., a sixth layer), another 4 nm layer of AsSeGeIn 37 (e.g., a seventh layer), another 1 nm layer of Ge3N4 38 (e.g., an eighth layer), another 4 nm layer of AsSeGeIn 39 (e.g., a ninth layer), another 1 nm layer of Ge3N4 40 (e.g., a tenth layer), another 4 nm layer of AsSeGeIn 41 (e.g., an eleventh layer), and a top 1 nm layer of Ge3N4 42 (e.g., a twelfth layer). Placing the Ge3N4 layers between the AsSeGeIn layers results in the multi-layer OTS 30 having a higher crystallization temperature and increased durability, as compared to the single-layer OTS 10 of FIG. 1. The thicknesses of layers 31, 32, 33, 34, 35, 36, 37, 38, 39, 40, 41 and 42 and the composition of layers 31, 32, 33, 34, 35, 36, 37, 38, 39, 40, 41 and 42 can be varied, as discussed below.

For example, the atomic percentages (at %) of the materials in layers 31, 33, 35, 37, 39 and 41 can be as follows: (i) As provided at 25 at % to 38 at %, (ii) Se provided at 30 at % to 60 at %, (iii) Ge provided at 8 at % to 20 at %, and (iv) In provided at 2 at % to 10 at %. Additionally, the thicknesses of the layers 31, 32, 33, 34, 35, 36, 37, 38, 39, 40, 41 and 42 can vary, such that the total thickness of the multi-layer OTS 30 can range from 15 nm to 50 nm. More specifically, the thicknesses of layers 31, 33, 35, 37, 39 and 41 can range from 2 nm to 15 nm and the thicknesses of layers 32, 34, 36, 38, 40 and 42 can range from 0.5 nm to 5 nm. Implementing Ge3N4, as opposed to GeN can provide improved results.

The composition of the thicker layers (e.g., 4 nm layers) and the thinner layers (e.g., the 1 nm layers) can be provided in amounts effective to (i) switch using an applied voltage pulse less than 5 nanoseconds in duration at a threshold voltage $V_t$<4V and (ii) have a crystallization transition temperature greater than 550° C. Furthermore, the composition of the thicker layers (e.g., 4 nm layers) and the thinner layers (e.g., the 1 nm layers) can be provided in amounts effective to (i) switch using an applied voltage pulse less than 5 nanoseconds in duration at a threshold voltage $V_t$<5V and (ii) have a crystallization transition temperature greater than 600° C.

Figure 4:
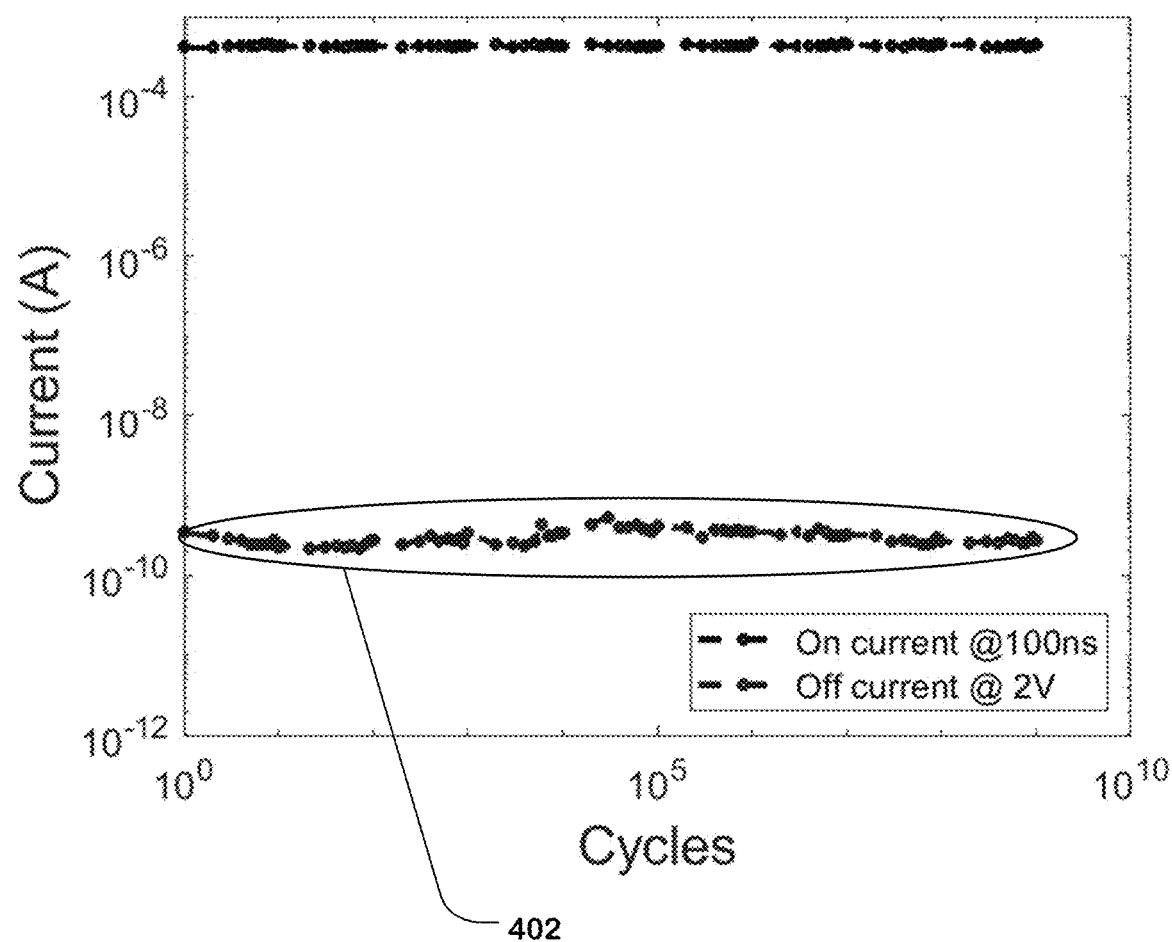
FIG. 4 is a graph showing endurance, showing on-current and off-current levels for the multi-layer OTS of FIG. 3.

FIG. 4 is a graph 400 showing on-current and off-current levels for the multi-layer OTS 30 of FIG. 3. Specifically, the graph 400 illustrates stability 402 of off current $I_{off}$ at 2V from $10^0$ to $10^{10}$ cycles. Furthermore, during testing of the multi-layer OTS 30, the Applicant found that only one OTS 60 fails out of 66 switching devices (OTSs) after 9E8 testing cycles, which is an improvement of 5 failures out of 66 switching devices after only 1E9 testing cycles, which has been observed with OTSs having other structures.

FIG. 5 is a table 500 illustrating results of testing a single-layer OTS that is approximately 30 nm thick and two different types of multi-layer OTSs that are approximately 30 nm thick. Specifically, the second row of the table 500 illustrates the test results of a 30 nm thick single-layer OTS, such as that discussed with reference to FIG. 1, having 8 at % In-AsSeGe. As illustrated in the second row, a crystallization temperature $T_x$ is 440° C., a switching threshold $V_t$ is 3.8 V, a current leakage $I_{off}$ is 0.3 nA at 2 V and an endurance is 5 failures out of 66 devices over 1E9 testing cycles.

The third row of the table 500 illustrates the test results of a 30 nm thick multi-layer OTS, such as that discussed with reference to FIG. 2, having 6 total alternating layers of 7 nm 8 at % In-AsSeGe and 3 nm GeN. Specifically, the third row illustrates a crystallization temperature $T_x$ of 600° C. or less, a switching threshold $V_t$ of 3.25, a current leakage $I_{off}$ of 100 nA at 2 V and an endurance of 9 failures out of 66 devices over 1E9 testing cycles.

The fourth row of the table 500 illustrates the test results of a 30 nm thick multi-layer OTS, such as that discussed with reference to FIG. 3, having 12 total alternating layers of 4 nm 8 at % In-AsSeGe and 1 nm GeN. Specifically, the fourth row illustrates a crystallization temperature $T_x$ being greater than 600° C., a switching threshold $V_t$ of 4.75, a current leakage $I_{off}$ of 0.97 nA at 2 V and an endurance of 1 failures out of 66 devices over 1E9 testing cycles.

Accordingly, the multi-layer OTS of the fourth row (e.g., the multi-layer OTS 30) provides better results that the multi-layer OTS of the third row and the single-layer OTS of the first row.

The current leakage $I_{off}$ can be improved by increasing a total thickness of the multi-layer OTS to 40 nm by adding additional layers and/or by increasing the thicknesses of the individual layers.

Figures 6, 7:
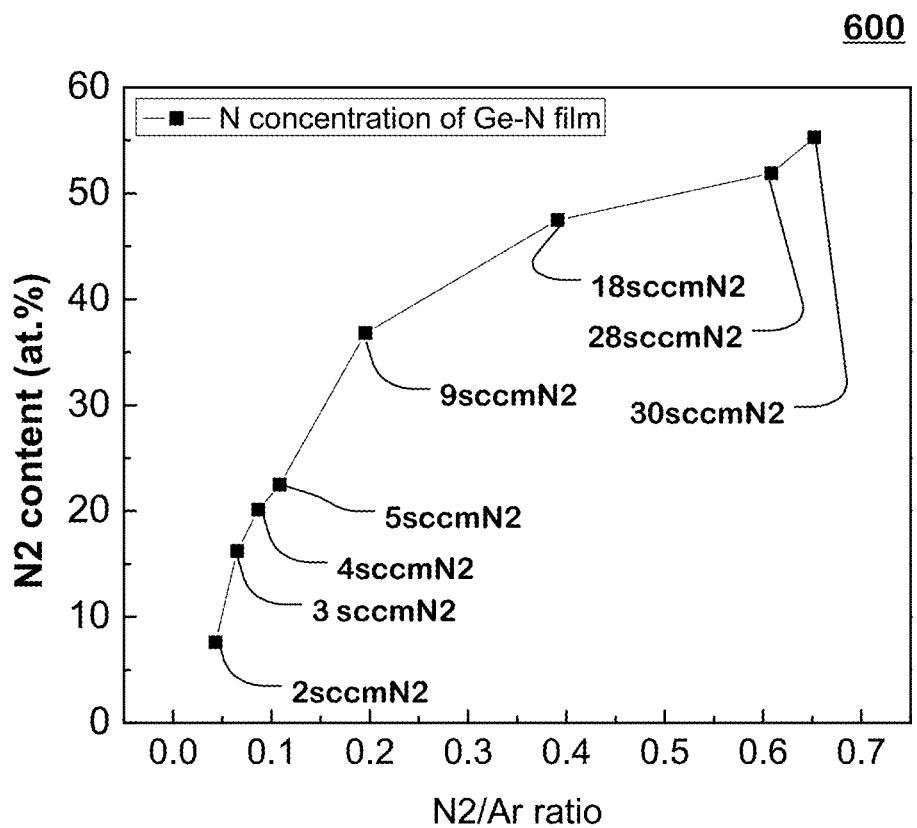
FIG. 6 includes a chart that graphs N2 content (at. %) v N2/Ar ratio for forming the GeN layer of a multi-layer OTS.
FIG. 7 illustrates a table identifying different at. % of Ge and N for different N2 flow rates.

FIG. 6 includes a chart 600 that graphs N2 content (at %) v N2/Ar ratio for forming the GeN layer (e.g., film) of a multi-layer OTS, as discussed throughout this document. The y-axis represents the N2 content inside the layer/film being formed and the x-axis represents the N2/Ar ratio during a physical vapor deposition (PVD) reactive sputtering process. During this PVD process a pure Ge target is used and a Ge—N layer/film is deposited with N2. As the Ar flow can be fixed to 46 standard cubic centimeters per minute (sccm), FIG. 12 illustrates 2sccmN2 to 30sccmN2 flow conditions. For example, for 30sccmN2 corresponds to 0.65 N2/Ar ratio on the x-axis. FIG. 7 illustrates a table 700 identifying different at % of Ge and N for different N2 flow rates. The flow rates of FIG. 7 correspond to the N2 content and N2/Ar ratio illustrated in FIG. 6.

For example, FIG. 7 illustrates that a flow rate of 2 standard cubic centimeters per minute of N2 (i.e., 2sccmN2) results in a layer having a Ge composition of 92.4 at % and an N composition of 7.6 at %. This flow rate is also illustrated in FIG. 6.

FIG. 7 illustrates that a flow rate of 3sccmN2 results in a layer having a Ge composition of 83.8 at % and an N composition of 16.2 at %. This flow rate is also illustrated in FIG. 6.

FIG. 7 also illustrates that a flow rate of 4sccmN2 results in a layer having a Ge composition of 79.9 at % and an N composition of 20.1 at %. This flow rate is also illustrated in FIG. 6.

FIG. 7 illustrates that a flow rate of 5sccmN2 results in a layer having a Ge composition of 77.5 at % and an N composition of 22.5 at %. This flow rate is also illustrated in FIG. 6.

FIG. 7 further illustrates that a flow rate of 9sccmN2 results in a layer having a Ge composition of 63.2 at % and an N composition of 36.8 at %. This flow rate is also illustrated in FIG. 6.

FIG. 7 illustrates that a flow rate of 18sccmN2 results in a layer having a Ge composition of 52.5 at % and an N composition of 47.5 at %. This flow rate is also illustrated in FIG. 6.

FIG. 7 also illustrates that a flow rate of 28sccmN2 results in a layer having a Ge composition of 48.1 at % and an N composition of 51.9 at %. This flow rate is also illustrated in FIG. 6.

FIG. 7 illustrates that a flow rate of 30sccmN2 results in a layer having a Ge composition of 44.7 at % and an N composition of 55.3 at %. This flow rate is also illustrated in FIG. 6. This flow rate produces a GeN layer that is near or at a composition of Ge3N4. This ratio of Ge to N provides the benefits discussed above with reference to the multi-layer OTS 30 of FIG. 3.

Figure 8:
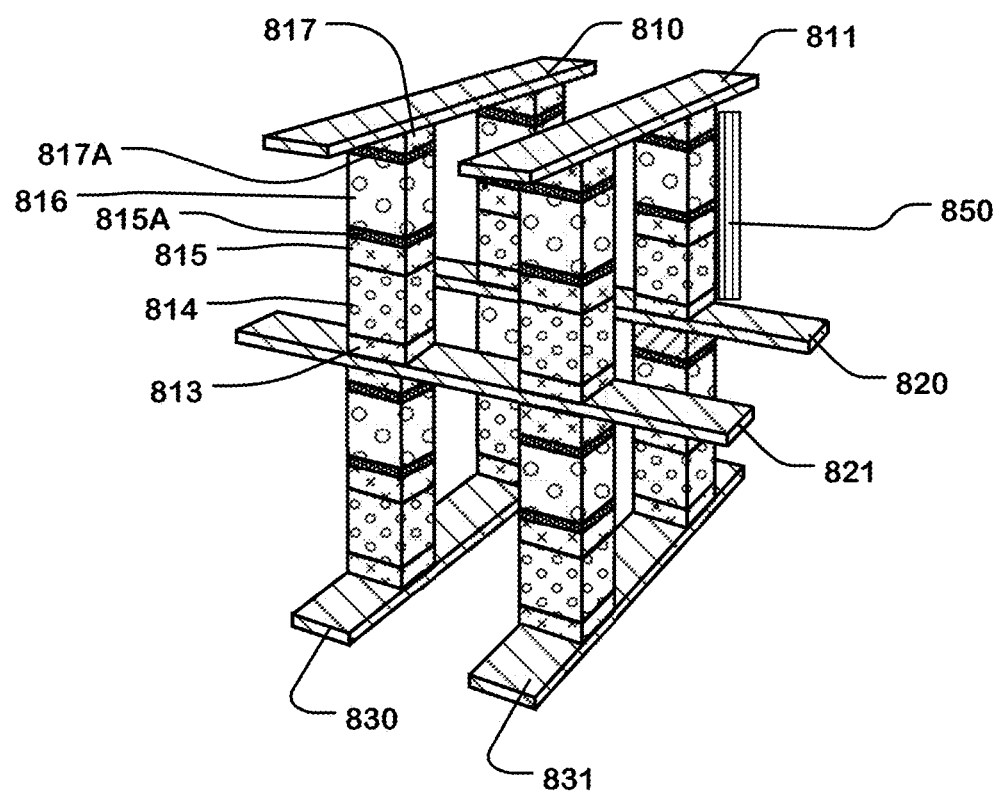
FIG. 8 is a schematic 3D cross-point memory device 1400, according to some embodiments of the disclosure.

FIG. 8 illustrates a schematic 3D cross-point memory device 800 (e.g., a memory device) according to some embodiments of the disclosure. The 3D cross-point memory device 800 includes an array of memory cells over a substrate. In an embodiment, all of the memory cells in the multiple layers of the 3D cross-point memory device 800 can include laminated encapsulation structures as represented by element 850. Having at least three conformal layers which can be atomic layer deposited (ALD) materials in which the contacting layers are dissimilar.

Also, in embodiments as described herein, the memory cell pillars can have a laminated encapsulation structure in which the first layer contacting the side walls of the pillar does not contain oxygen. In embodiments provided, the laminated encapsulation structure can comprise alternating layers of silicon nitride and silicon oxide in which the first layer is silicon nitride. Only one element 850 is illustrated to limit density illustrated in FIG. 8.

Each pillar of the memory device 800 can comprise a stack of materials that have a side wall, such as a circular, oval, rectangular, or cylindrical side wall, and can include a layer of phase change materials or other programmable resistance memory materials. First conductors 810, 811 can be configured as word lines for a connection to decoded voltage drivers and second conductors 820, 821 can be configured as bit lines for connection to sense amplifiers. Further, third conductors 830, 831 can be configured as word lines. Specifically, a pillar forms a memory cell including a memory element and the switching device including the multi-layer OTS 814 disposed between bit line 821 and the word line 810. In this example, the pillar can include, in series between the bit line 821 and the word line 810, a first intermediate layer 813, the multi-layer OTS 814 (e.g., the multi-layer OTS 20 of FIG. 2, the multi-layer OTS 30 of FIG. 3, etc., as described above), a second intermediate layer 815, a phase change memory material layer 816 which acts as a memory element, and a third intermediate layer 817.

In this embodiment, the pillar can include (barrier) layer 815A between the second intermediate layer 815 and the phase change memory material layer 816. Further, in this embodiment, the pillar can include (barrier) layer 817A between the third intermediate layer 817 and the phase change memory material layer 816. The layers 815A and 817A can be comprised of a metal such as tungsten or other metal or metal alloy which have a melting point above 2000° C. (i.e., refractory metal), or other materials chosen for compatibility with the phase change memory material layer 816. The layers 813, 815 and 817 can be carbon-based material or carbon which is pure as deposited. The pillar materials are configured so that the memory element (e.g., the phase change memory material layer 816) and the switch element (e.g., the multi-layer OTS 814) are in electrical series between the word line 810 and the bit line 821.

In another example, the multi-layer OTS 814 and memory element (e.g., the phase change memory material layer 816) are inverted, so that the memory element is closer to the bit line 821.

Furthermore, each memory cell (pillar) in the array includes an access device (e.g., the multi-layer OTS 814) and a memory layer (e.g., the phase change memory material layer 816). In the illustrated embodiment, the memory cells are oriented such that the access device is below the memory layer. In other embodiments, the memory cells can be structured so that the upper level (e.g., the portion between the word line 810 and the bit line 821) includes the access devices above the memory layer, and the lower level (e.g., the portion between the bit line 821 and the word line 830) includes the access devices below the memory layer.

As explained, the access device in this embodiment can be the multi-layer OTS 814 (e.g., the multi-layer OTS 20 of FIG. 2, the multi-layer OTS 30 of FIG. 3, etc., as described above). The memory layer can be comprised of a first barrier layer 815A on the second intermediate layer 815, a layer of the phase change memory material 816 on the first barrier layer 815A, a second barrier layer 817A on the layer of the phase change memory material 816, and the third intermediate layer 817 (e.g., top electrode) on the second barrier layer 817A.

Figure 9:
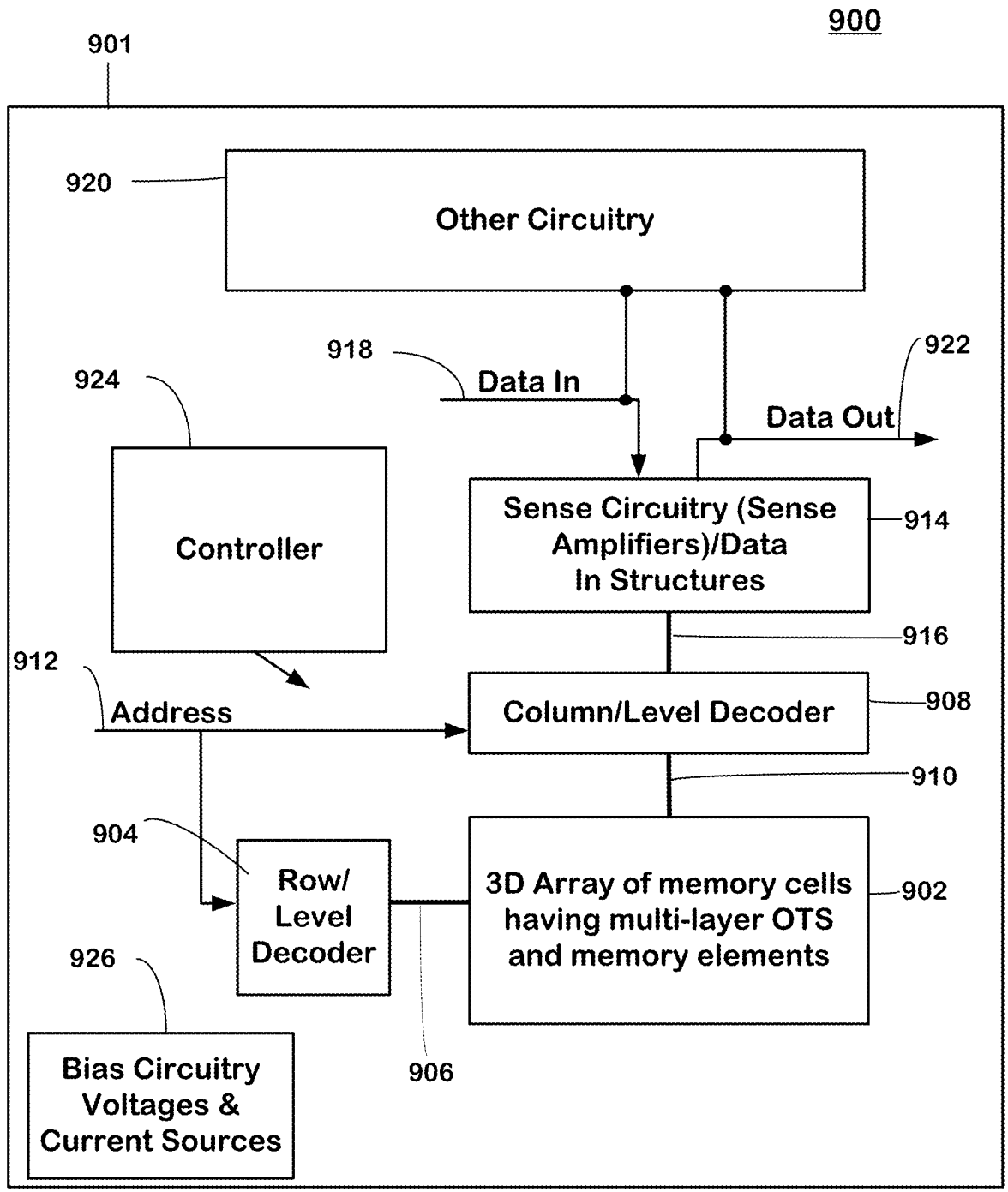
FIG. 9 is a simplified block diagram of an integrated circuit including a 3D array of cross-point memory cells having switching devices including multi-layer OTSs.

FIG. 9 is a simplified block diagram 900 of an integrated circuit 901 including a 3D array 902 of cross-point memory cells which have switching devices including multi-layer OTSs as described herein, with programmable resistance memory layers. A row/level line decoder 904 having read, set and reset modes is coupled to, and in electrical communication with, a plurality of word lines 906 arranged in levels and along rows in the array 902. A column/level decoder 908 is in electrical communication with a plurality of bit lines 910 arranged in levels and along columns in the array 902 for reading, setting, and resetting the memory cells in the array 902.

Addresses are supplied on a bus 912 to the row/level line decoder 904 and the column/level decoder 908. Sense circuitry (Sense amplifiers) and data-in structures in block 914, including voltage and/or current sources for the read, set, and reset modes are coupled to the column/level decoder 908 via data bus 916. Data is supplied via a data-in line 918 from input/output ports on integrated circuit 901, or from other data sources internal or external to the integrated circuit 901, to data-in structures in block 914. Other circuitry 920 may be included on the integrated circuit 901, such as a general purpose processor or special purpose application circuitry, or a combination of modules providing system-on-a-chip functionality supported by array 902. Data is supplied via a data-out line 922 from the sense amplifiers in block 914 to input/output ports on the integrated circuit 901, or to other data destinations internal or external to integrated circuit 901.

A controller 924 implemented in this example, using a bias arrangement state machine, controls the application of bias circuitry voltage sources and current sources 926 for the application of bias arrangements, which include reading, setting, resetting, and verifying voltages, and/or currents for the word lines and bit lines. The controller 924 includes control circuitry configured for switching layers as described herein, depending on the structure and composition of the switching layer, by applying a voltage to a selected memory cell so that the voltage on the switch in the select memory cell is above the threshold $V_t$, and a voltage to an unselected memory cell so that the voltage on the switch in unselected memory cell is below the threshold $V_t$ during a read operation or other operation accessing the selected memory cell. Also, the voltage applied to unselected cells during a read of the selected memory cells is set such that the off-state current is preferably less than 2 nA or less than 1 nA at 2 V, depending on the structure and composition of the switching layer during a read operation accessing the selected memory cell.

Controller 924 may be implemented using special-purpose logic circuitry as known in the art. In alternative embodiments, controller 924 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 924.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A switching device, comprising:
a first electrode;
a second electrode; and
a multi-layer ovonic threshold switch (OTS) between the first and second electrodes, the multi-layer OTS including a first layer and a second layer,
wherein the first layer and the second layer are different compositions,
wherein the second layer includes germanium (Ge) and nitrogen (N), and
wherein the Ge in the second layer is in a range of 40 at % to 95 at % of the composition of the second layer and the N in the second layer is in a range of 5 at % to 60 at % of the composition of the second layer.

2. The switching device of claim 1, wherein the Ge in the second layer is in a range of 40 at % to 80 at % of the composition of the second layer and the N in the second layer is in a range of 60 at % to 20 at % of the composition of the second layer.

3. The switching device of claim 2, wherein the Ge and N composition of the second layer is Ge3N4.

4. The switching device of claim 1, wherein the Ge and N composition of the second layer is effective to have a crystallization transition temperature greater than 600° C.

5. The switching device of claim 1, wherein the first layer includes arsenic (As), selenium (Se) and germanium (Ge).

6. The switching device of claim 5, wherein the multi-layer OTS includes a plurality of the first layers and a plurality of the second layers, wherein the first layers and the second layers are stacked in an alternating manner.

7. The switching device of claim 6, wherein a thickness of each first layer of the plurality of the first layers ranges from 2 nanometers to 15 nanometers, inclusive and a thickness of each second layer of the plurality of the second layers ranges from 0.5 nanometers to 5 nanometers, inclusive.

8. The switching device of claim 5,
wherein the first layer further includes indium (In), and
wherein the As in the first layer is in a range of 25 at % to 38 at %, the Se in the first layer is in a range of 30 at % to 60 at %, the Ge in the first layer is in a range of 8 at % to 20 at % and the In in the first layer is in a range of 2 at % to 10 at %.

9. The switching device of claim 5, wherein the first layer further includes silicon (Si).

10. The switching device of claim 9, wherein the first layer further includes indium (In).

11. The switching device of claim 1, wherein the multi-layer OTS has a thickness in a range of 15 nanometers to 50 nanometers, inclusive.

12. The switching device of claim 1,
wherein the multi-layer OTS includes six layers, including the first and second layers,
wherein the third and fifth layers have the same composition of the first layer,
wherein the fourth and sixth layers have the same composition of the second layer, and
wherein the six layers are disposed in the multi-layer OTS in numerical order, such that at least two even numbered layers are located between different pairs of odd numbered layers.

13. The switching device of claim 12,
wherein each odd numbered layer of the odd numbered layers has a thickness of approximately 7 nanometers, and
wherein each even numbered layer of the even numbered layers has a thickness of approximately 3 nanometers, such that a thickness of the multi-layer OTS is approximately 30 nanometers.

14. The switching device of claim 1,
wherein the multi-layer OTS includes twelve layers, including the first and second layers,
wherein the third, fifth, seventh, ninth and eleventh layers have the same composition of the first layer,
wherein the fourth, sixth, eight, tenth and twelfth layers have the same composition of the second layer, and
wherein the twelve layers are disposed in the multi-layer OTS in numerical order, such that at least five even numbered layers are located between different pairs of odd numbered layers.

15. The switching device of claim 14,
wherein each odd numbered layer of the odd numbered layers has a thickness of approximately 4 nanometers, and
wherein each even numbered layer of the even numbered layers has a thickness of approximately 1 nanometer, such that a thickness of the multi-layer OTS is approximately 30 nanometers.

16. A method of forming a memory device, comprising:
providing a first electrode;
providing a second electrode; and
providing a memory element in contact with the first electrode; and
providing a multi-layer ovonic threshold switch (OTS) in series with the memory element and between the first and second electrodes, the multi-layer OTS including a first layer and a second layer, the first layer and the second layer having different compositions, and the second layer including germanium (Ge) and nitrogen (N),
wherein the Ge in the second layer is in a range of 40 at % to 95 at % of the composition of the second layer and the N in the second layer is in a range of 5 at % to 60 at % of the composition of the second layer.

17. The method of claim 16,
wherein the multi-layer OTS includes a plurality of the first layers and a plurality of the second layers, wherein the first layers and the second layers are stacked in an alternating manner; and
wherein a thickness of each first layer of the plurality of the first layers ranges from 2 nanometers to 15 nanometers, inclusive and a thickness of each second layer of the plurality of the second layers ranges from 0.5 nanometers to 5 nanometers, inclusive.

18. The method of claim 16,
wherein the multi-layer OTS includes twelve layers, including the first and second layers,
wherein the third, fifth, seventh, ninth and eleventh layers have the same composition of the first layer,
wherein the fourth, sixth, eight, tenth and twelfth layers have the same composition of the second layer, and
wherein the twelve layers are disposed in the multi-layer OTS in numerical order, such that at least five even numbered layers are located between different pairs of odd numbered layers.

19. The method of claim 18,
wherein each odd numbered layer of the odd numbered layers has a thickness of approximately 4 nanometers, and
wherein each even numbered layer of the even numbered layers has a thickness of approximately 1 nanometer, such that a thickness of the multi-layer OTS is approximately 30 nanometers.

20. A switching device, comprising:
a first electrode;
a second electrode; and
a multi-layer ovonic threshold switch (OTS) between the first and second electrodes, the multi-layer OTS including a first layer and a second layer,
wherein the first layer and the second layer are different compositions,
wherein the second layer includes germanium (Ge) and nitrogen (N),
wherein the multi-layer OTS includes six layers, including the first and second layers,
wherein the third and fifth layers have the same composition of the first layer,
wherein the fourth and sixth layers have the same composition of the second layer, and
wherein the six layers are disposed in the multi-layer OTS in numerical order, such that at least two even numbered layers are located between different pairs of odd numbered layers,
wherein each odd numbered layer of the odd numbered layers has a thickness of approximately 7 nanometers, and
wherein each even numbered layer of the even numbered layers has a thickness of approximately 3 nanometers, such that a thickness of the multi-layer OTS is approximately 30 nanometers.

* * * * *